US012761286B2

(12) United States Patent
Choi

(10) Patent No.: US 12,761,286 B2
(45) Date of Patent: Oct. 13, 2026

(54) BATTERY DIAGNOSING DEVICE AND METHOD

(71) Applicant: LG ENERGY SOLUTION, LTD., Seoul (KR)

(72) Inventor: Soon-Hyung Choi, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 19/031,030

(22) Filed: Jan. 17, 2025

(65) Prior Publication Data

US 2026/0133255 A1 May 14, 2026

(30) Foreign Application Priority Data

Jan. 19, 2024 (KR) ........................ 10-2024-0009037

(51) Int. Cl.

| | |
|---|---|
| ***G01R 31/392*** | (2019.01) |
| ***B60L 58/16*** | (2019.01) |
| ***G01R 31/36*** | (2020.01) |
| ***G01R 31/367*** | (2019.01) |
| ***G01R 31/378*** | (2019.01) |
| ***G01R 31/382*** | (2019.01) |

(Continued)

(52) U.S. Cl.

CPC ............ *G01R 31/392* (2019.01); *B60L 58/16* (2019.02); *G01R 31/367* (2019.01); *G01R 31/378* (2019.01); *G01R 31/3835* (2019.01); *H02J 7/84* (2026.01); *H02J 7/933* (2026.01); *G01R 31/3648* (2013.01); *G01R 31/382* (2019.01); *G01R 31/388* (2019.01)

(58) Field of Classification Search

CPC .. G01R 31/392; G01R 31/367; G01R 31/378; G01R 31/3835; G01R 31/382; G01R 31/3648; G01R 31/388; B60L 58/16; H02J 7/84; H02J 7/933

See application file for complete search history.

(56) References Cited

U.S. PATENT DOCUMENTS

| | | | |
|---|---|---|---|
| 2012/0244432 | A1 | 9/2012 | Park et al. |
| 2015/0100260 | A1 | 4/2015 | Joe et al. |

(Continued)

FOREIGN PATENT DOCUMENTS

| | | | |
|---|---|---|---|
| JP | 2017-20916 | A | 1/2017 |
| JP | 2020-47587 | A | 3/2020 |

(Continued)

*Primary Examiner* — Christian T Bryant

(74) *Attorney, Agent, or Firm* — BRYAN CAVE LEIGHTON PAISNER LLP

(57) ABSTRACT

A battery diagnosis method according to the present disclosure includes a first generation step of generating a second profile by dividing a first profile representing a correlation between a State of Charge (SOC) and a voltage of a battery into a first portion corresponding to a first material and a second portion corresponding to a second material and removing the first portion from the first profile; a second generation step of generating a third profile by estimating a correlation between the SOC and voltage of the battery in an entire SOC range of the battery based on the second profile; and a diagnosis step of diagnosing the battery based on a calculated capacity, wherein the capacity is provided by the first material, among a total capacity provided by an electrode active material based on the third profile.

17 Claims, 9 Drawing Sheets

(51) Int. Cl.

| | |
|---|---|
| ***G01R 31/3835*** | (2019.01) |
| ***G01R 31/388*** | (2019.01) |
| ***H02J 7/84*** | (2026.01) |
| ***H02J 7/90*** | (2026.01) |

(56) References Cited

U.S. PATENT DOCUMENTS

| | | | | |
|---|---|---|---|---|
| 2019/0346512 | A1 | 11/2019 | Iguchi et al. | |
| 2020/0091567 | A1 | 3/2020 | Takahashi | |
| 2020/0191872 | A1 | 6/2020 | Song et al. | |
| 2020/0408846 | A1* | 12/2020 | Bae | B60L 3/12 |
| 2022/0026498 | A1 | 1/2022 | Nishikawa et al. | |
| 2022/0373610 | A1 | 11/2022 | Yoon et al. | |
| 2022/0393229 | A1 | 12/2022 | Kim | |
| 2023/0039356 | A1 | 2/2023 | Jee et al. | |
| 2025/0237706 | A1* | 7/2025 | Park | G01R 31/3835 |
| 2025/0362348 | A1* | 11/2025 | Choi | G01R 31/367 |

FOREIGN PATENT DOCUMENTS

| | | | |
|---|---|---|---|
| JP | WO2020/129478 | A1 | 11/2021 |
| KR | 10-2012-0095803 | A | 8/2012 |
| KR | 10-2013-0126273 | A | 11/2013 |
| KR | 10-2018-0121063 | A | 11/2018 |
| KR | 10-2019-0129754 | A | 11/2019 |
| KR | 10-2020-0078227 | A | 7/2020 |
| KR | 10-2021-0053748 | A | 5/2021 |
| KR | 10-2021-0057610 | A | 5/2021 |
| KR | 10-2022-0009918 | A | 1/2022 |
| KR | 10-2022-0028270 | A | 3/2022 |

* cited by examiner

BATTERY DIAGNOSING DEVICE AND METHOD

CROSS-REFERENCE TO RELATED APPLICATIONS

This application is based on and claims priority from Korean Patent Application No. 10-2024-0009037, filed on Jan. 19, 2024, with the Korean Intellectual Property Office, the disclosure of which is incorporated herein in its entirety by reference.

TECHNICAL FIELD

The present disclosure relates to a secondary battery diagnosing apparatus and method.

BACKGROUND

Recently, as the demand for portable electronic products such as notebook computers, digital cameras, and portable telephones has rapidly increased, and as the development of electric vehicles, energy storage systems, robots, and satellites has begun in earnest, researches on the high-performance batteries allowing charging and discharging are actively underway.

Types of rechargeable batteries include lithium batteries that use lithium ions, such as lithium-ion batteries and lithium-ion polymer batteries, as well as nickel-cadmium batteries, nickel-metal hydride batteries, and nickel-zinc batteries. Of these batteries, lithium batteries have several advantages of exhibiting almost no memory effect, resulting in a relatively long lifespan, very low self-discharge rate, and high energy density, as compared to nickel-based batteries. Due to these advantages, the application range of lithium batteries is gradually expanding.

SUMMARY

In one embodiment of the present disclosure, there are provided a battery diagnosing apparatus and method thereof capable of rapidly and accurately diagnosing a battery that uses an electrode active material, such as silicon or silicon oxide, which deforms the shape of a profile representing a correlation between the stage of charge (SOC) and voltage of the battery in various directions as the battery deteriorates.

In another embodiment of the present disclosure, there are provided a battery diagnosing apparatus and method capable of diagnosing the deterioration of silicon or silicon oxide separately from graphite, for a battery employing an electrode active material that is a blend of silicon or silicon oxide and graphite.

In yet another embodiment of the present disclosure, there are provided a battery pack and vehicle including a battery diagnosing apparatus according to the present disclosure.

A battery diagnosing method according to one aspect of the present disclosure is a method for diagnosing a battery employing an electrode active material that is a blend of a first material and a second material, including: a first generation step of generating a second profile by dividing a first profile representing a correlation between a State of Charge (SOC) and a voltage of the battery into a first portion corresponding to the first material and a second portion corresponding to the second material and removing the first portion from the first profile; a second generation step of generating a third profile by estimating a correlation between the SOC and voltage of the battery in an entire SOC range of the battery based on the second profile; and a diagnosis step of calculating a capacity provided by the first material, among a total capacity provided by the electrode active material based on the third profile and diagnosing the battery based on the calculated capacity.

In one embodiment, the battery diagnosing method may further include, before the first generation step, generating the first profile based on voltage values of the battery measured during discharge of the battery.

In one embodiment, in the generating the second profile, the first profile may be divided into the first portion and the second portion based on a predetermined SOC value.

In one embodiment, the predetermined SOC value may be determined in advance according to a composition ratio of the first material and the second material.

In one embodiment, the generating the second profile may include: before generating the second profile, generating a differential profile representing a correlation between the SOC of the battery and a differential voltage obtained by differentiating the voltage of the battery with respect to a capacity; detecting a predetermined peak point or valley point among peak points and valley points appearing in the differential profile, and determining an SOC value corresponding to the detected peak point or valley point; and dividing the first profile into the first portion and the second portion based on the determined SOC value.

In one embodiment, the second generation step may include: before generating the third profile, generating an adjusted positive electrode profile and adjusted negative electrode profile corresponding to the second profile by adjusting a reference positive electrode profile representing a correlation between an SOC and a positive electrode potential of a predetermined reference battery and a reference negative electrode profile representing a correlation between the SOC and a negative electrode potential of the reference battery, and generating the third profile based on the adjusted positive electrode profile and the adjusted negative electrode profile.

In one embodiment, the adjusted positive electrode profile and the adjusted negative electrode profile may be generated by adjusting at least one of a position, scale, and shape of each of the reference positive electrode profile and the reference negative electrode profile on a predetermined coordinate axis.

In one embodiment, the third profile may be generated by calculating a potential difference for each SOC between the adjusted positive electrode profile and the adjusted negative electrode profile.

In one embodiment, in the diagnosing, the capacity provided by the first material may be calculated by excluding a capacity provided by the second material from the total capacity.

In one embodiment, the diagnosing may include comparing the calculated capacity with a predetermined reference capacity to diagnose the battery.

In one embodiment, the first material may be silicon or silicon oxide, and the second material may include graphite.

A battery diagnosing apparatus according to another aspect of the present disclosure is an apparatus for diagnosing a battery employing an electrode active material that is a blend of a first material and a second material, including: a first generation unit configured to generate a second profile by dividing a first profile representing a correlation between a State of Charge (SOC) and a voltage of the battery into a first portion corresponding to the first material and a second portion corresponding to the second material and removing the first portion from the first profile; a second generation unit configured to generate a third profile by estimating a correlation between the SOC and voltage of the battery in an entire SOC range of the battery based on the second profile; and a diagnosis unit configured to calculate a capacity provided by the first material, among a total capacity provided by the electrode active material based on the third profile and diagnose the battery based on the calculated capacity.

In one embodiment, the first generation unit may be configured to generate the second profile by dividing the first profile into the first portion and the second portion based on a predetermined SOC value and removing the first portion from the first profile.

In one embodiment, the second generation unit may include an adjustment module configured to generate an adjusted positive electrode profile and an adjusted negative electrode profile corresponding to the second profile by adjusting a reference positive electrode profile representing a correlation between an SOC and a positive electrode potential of a predetermined reference battery and a reference negative electrode profile representing a correlation between the SOC and a negative electrode potential of the reference battery; and a third profile generation module configured to generate the third profile based on the adjusted positive electrode profile and the adjusted negative electrode profile.

In one embodiment, the battery diagnosing apparatus may further include a charge/discharge adjustment unit configured to adjust a charge/discharge status of the battery, such as a full-charge voltage of the battery or a current rate of charge current or discharge current of the battery, based on a diagnosis result of the diagnosis unit.

A battery pack according to another aspect of the present disclosure includes the battery diagnosing apparatus described above.

A vehicle according to another aspect of the present disclosure includes the battery diagnosing apparatus described above.

According to the present disclosure, when diagnosing a battery employing an electrode active material that is a blend of a first material and a second material, a second profile is generated by dividing a first profile representing a correlation between the SOC and voltage of the battery into a first portion corresponding to the first material and a second portion corresponding to the second material and removing the first portion from the first profile, and the battery is diagnosed based on the second profile. As a result, it is possible to achieve rapid and accurate diagnosis of the battery even when the first material is a material, such as silicon or silicon oxide, which deforms the shape of the battery profile in various directions as the battery deteriorates.

Further, according to the present disclosure, a capacity provided by the first material is calculated, among the total capacity provided by the electrode active material, and the battery is diagnosed based on the calculated capacity. As a result, it is possible to diagnose the deterioration of the first material separately from the overall status of the battery. That is, the present disclosure may diagnose the deterioration of silicon or silicon oxide separately from graphite, for a battery employing a negative electrode active material that is a blend of silicon or silicon oxide and graphite.

Moreover, those skilled in the art will readily understand from the following description that various embodiments of the present disclosure may solve various technical issues not mentioned above.

BRIEF DESCRIPTION OF THE DRAWINGS

The following drawings attached to this specification illustrate embodiments of the present disclosure and serve to further enhance the understanding of the technical spirit of the present disclosure in conjunction with the description provided below. Therefore, the present disclosure should not be construed as being limited to only the matters depicted in these drawings.

DETAILED DESCRIPTION

Hereinafter, embodiments according to the present disclosure will be described with reference to the accompanying drawings to clearly describe solutions corresponding to the technical issues of the present disclosure. However, when describing the present disclosure, descriptions of related known technologies may be omitted when they obscure the gist of the present disclosure.

The terms such as "first," "second," "firstly," or "secondly" may be used simply to distinguish one component from another component and do not limit the components in other aspects (e.g., importance or order).

In addition, the terms used in this specification are defined in consideration of the functions in the present disclosure and may vary depending on the intention of the designer or manufacturer, customs, and other factors. Therefore, the definitions of the terms described below need to be derived based on the overall content of this specification.

A positive electrode and a negative electrode of a battery gradually deteriorate over repeated charge and discharge cycles, failing to maintain the electrical capacity they had at the time of manufacture. Therefore, accurate diagnosis for the battery status is necessary to enable accurate predictions regarding, for example, the battery usable time, remaining lifespan, and replacement timing.

However, conventional technologies have difficulties in accurately diagnosing batteries employing electrode active materials, such as silicon or silicon oxide, which deform the shape of a profile representing a correlation between the SOC and voltage of a battery in various directions as the battery deteriorates. This is because when the shape of the battery profile does not shrink in a certain direction but instead deforms in various directions as the battery deteriorates, it is difficult to approximate the battery status using a predetermined reference profile.

Furthermore, conventional technologies fail to provide a method for diagnosing the deterioration of silicon or silicon oxide separately from graphite, for a battery employing a negative electrode active material that is a blend of silicon or silicon oxide and graphite.

In consideration of this, the present disclosure provides a battery diagnosing apparatus and method for diagnosing the status of a rechargeable battery in a non-destructive manner, for example.

Figure 1:
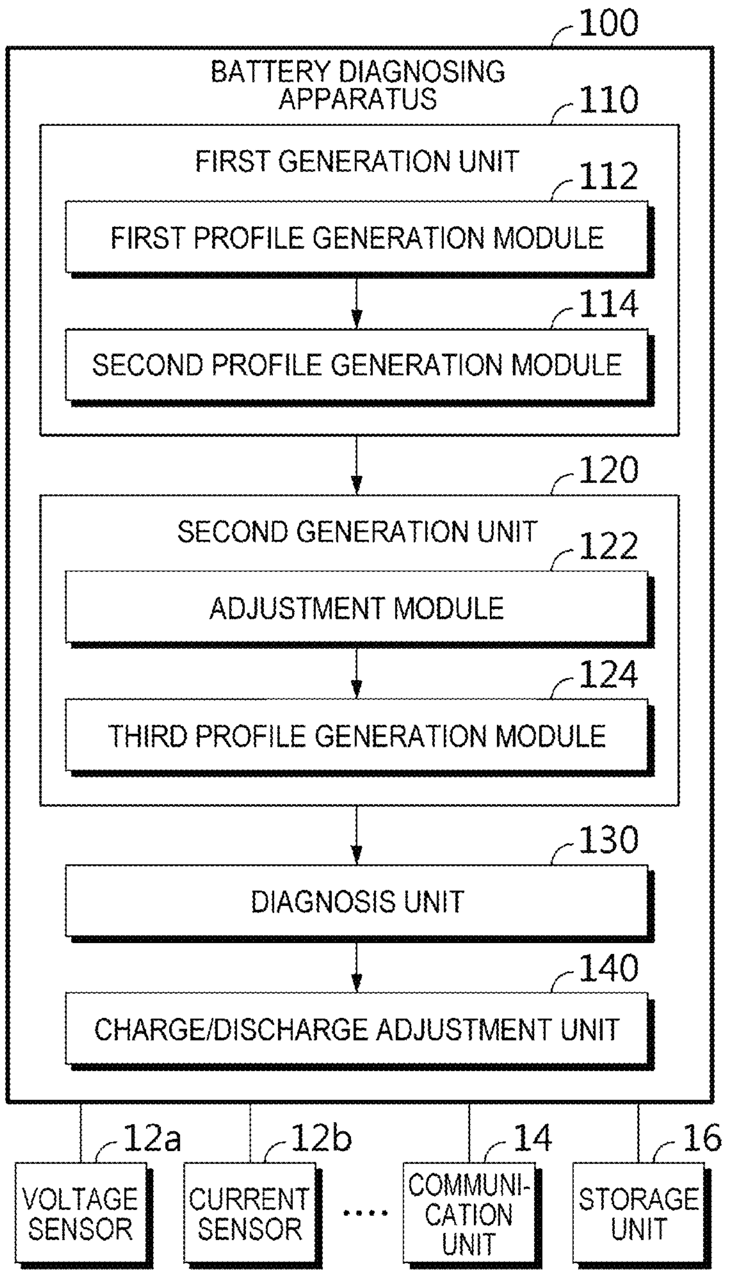
FIG. 1 is a block diagram illustrating a battery diagnosing apparatus according to one embodiment of the present disclosure.

FIG. 1 is a block diagram illustrating a battery diagnosing apparatus 100 according to one embodiment of the present disclosure.

As illustrated in FIG. 1, the battery diagnosing apparatus 100 according to one embodiment of the present disclosure is an apparatus configured to diagnose the status of a rechargeable battery, and includes a first generation unit 110, a second generation unit 120, and a diagnosis unit 130, and may further include a charge/discharge adjustment unit 140 according to an embodiment.

The battery (hereinafter, referred to as "target battery") to be diagnosed by the battery diagnosing apparatus 100 according to the present disclosure may be a battery cell corresponding to a basic charge/discharge unit, a battery module in which multiple battery cells are connected in series and/or in parallel, or a battery pack in which multiple battery cells or multiple battery modules are connected in series and/or in parallel.

The target battery may include an electrode assembly in which a positive electrode and a negative electrode are stacked one above another with a separator interposed therebetween, and a case which accommodates the electrode assembly along with an electrolyte material.

Meanwhile, the positive electrode constituting the electrode assembly of the target battery may include a positive electrode substrate made of a material including aluminum and a positive electrode active material applied to the positive electrode substrate. The positive electrode active material may include lithium-based oxide. The positive electrode active material may be applied to the positive electrode substrate along with a conductive additive, a binder, and other components.

The negative electrode of the electrode assembly may include a negative electrode substrate made of a material including copper, and a negative electrode active material applied to the negative electrode substrate. The negative electrode active material may include a silicon-based material, such as silicon (Si) or silicon oxide ($SiO_x$), and graphite. The negative electrode active material may be a mixture in which the silicon-based material and graphite are blended at a predetermined composition ratio. The negative electrode active material may be applied to the negative electrode substrate along with a conductive additive, a binder, and other components.

In this way, by incorporating silicon (Si) or silicon oxide ($SiO_x$) into the negative electrode active material of the battery, the electrical capacity provided by the same weight of the negative electrode active material may be increased, thereby enhancing the energy density of a battery cell.

A profile representing a correlation between the State of Charge (SOC) and voltage of a battery employing an electrode active material such as silicon (Si) or silicon oxide ($SiO_x$) does not simply shrink in one direction but instead deforms in multiple directions as the battery deteriorates.

Furthermore, the deterioration of the battery employing an electrode active material such as silicon (Si) or silicon oxide ($SiO_x$) is primarily caused by the deterioration of silicon (Si) or silicon oxide ($SiO_x$). Therefore, when diagnosing the battery, it is necessary to diagnose the deterioration of silicon (Si) or silicon oxide ($SiO_x$) separately from graphite with which it is blended.

The battery diagnosing apparatus 100 according to the present disclosure is configured to diagnose a battery employing an electrode active material that is a blend of a first material and a second material.

The first generation unit 110 is configured to generate a second profile by dividing a first profile, which represents a correlation between the SOC and voltage of the target battery, into a first portion corresponding to the first material and a second portion corresponding to the second material, and removing the first portion from the first profile.

The second generation unit 120 is configured to generate a third profile by estimating a correlation between the SOC and voltage of the battery in the entire SOC range of the battery based on the second profile.

The diagnosis unit 130 is configured to calculate the capacity provided by the first material, among the total capacity provided by the electrode active material based on the third profile, and diagnose the battery based on the calculated capacity.

In one embodiment, the first generation unit 110 may include a first profile generation module 112 and a second profile generation module 114.

The first profile generation module 112 may be configured to generate the first profile based on voltage values of the target battery measured during the charge or discharge of the target battery.

For example, when the first material is silicon (Si) or silicon oxide ($SiO_x$) and the second material is graphite, the first profile generation module 112 may generate the first profile based on voltage values of the target battery measured while the "discharge" of the target battery.

Silicon (Si) or silicon oxide ($SiO_x$) acts across the entire SOC range of the target battery during the charge of the target battery but acts only within a lower SOC range among the entire SOC range of the target battery during the discharge of the target battery. Therefore, the first portion corresponding to silicon (Si) or silicon oxide ($SiO_x$) may be easily distinguished from the remaining portion in the first profile obtained during the discharge of the target battery.

For reference, the current capacity of the target battery may be calculated by applying a current integration method to the charge current or discharge current of the target battery.

Next, the second profile generation module 114 may be configured to generate the second profile by dividing the first profile into the first portion and the second portion based on a predetermined SOC value, and removing the first portion from the first profile.

In one embodiment, the predetermined SOC value used to determine the removal portion of the first profile may be determined in advance according to the composition ratio of the first material and the second material.

In another embodiment, the predetermined SOC value may be determined based on a differential profile, which represents a correlation between the SOC of the target battery and a differential voltage obtained by differentiating the voltage of the target battery with respect to the capacity thereof.

The second profile generation module 114 may include first to third sub-modules (not illustrated). The first sub-module may be configured to generate the differential profile, before generating the second profile. The second sub-module may be configured to detect a predetermined peak point or valley point among peak points and valley points appearing in the differential profile, and determining a SOC value corresponding to the detected peak point or valley point. The third sub-module may be configured to divide the first profile into the first portion and the second portion based on the determined SOC value and remove the first portion from the first profile to generate the second profile.

In one embodiment, the second generation unit 120 may include an adjustment module 122 and a third profile generation module 124.

The adjustment module 122 may be configured to generate an adjusted positive electrode profile and an adjusted negative electrode profile corresponding to the second profile by adjusting a reference positive electrode profile, which represents a correlation between the SOC and positive electrode potential of a predetermined reference battery, and a reference negative electrode profile, which represents a correlation between the SOC and negative electrode potential of the reference battery, before generating the third profile. The reference battery may be the target battery at the time of Beginning of Life (BOL), or a normal-status battery with the same configuration as the target battery.

For example, the adjustment module 122 may generate the adjusted positive electrode profile and the adjusted negative electrode profile by adjusting at least one of the position, scale, and shape of each of the reference positive electrode profile and the reference negative electrode profile on a predetermined coordinate axis.

As the adjusted positive electrode profile and the adjusted negative electrode profile, a candidate positive electrode profile and a candidate negative electrode profile that create a curve with the smallest error relative to the second profile through mutual combination may be selected respectively, among various candidate positive electrode profiles and various candidate negative electrode profiles, which are generated by shifting or deforming the reference positive electrode profile and the reference negative electrode profile, respectively, on a plane where the horizontal axis represents the SOC of the target battery and the vertical axis represents the voltage of the target battery.

Next, the third profile generation module 124 may be configured to generate the third profile based on the adjusted positive electrode profile and the adjusted negative electrode profile.

For example, the third profile generation module 124 may be configured to generate the third profile by calculating the potential difference for each SOC between the adjusted positive electrode profile and the adjusted negative electrode profile.

The diagnosis unit 130 may diagnose the target battery based on the third profile.

The diagnosis unit 130 may be configured to calculate the capacity provided by the first material, among the total capacity provided by the electrode active material based on the third profile, and diagnose the battery based on the calculated capacity.

The diagnosis unit 130 may calculate the capacity provided by the first material by excluding the capacity provided by the second material from the total capacity.

Further, the diagnosis unit 130 may be configured to diagnose the target battery by comparing the calculated capacity with a predetermined reference capacity. The reference capacity may be the capacity provided by the first material of the target battery at the time of BOL, or the intended design capacity of the target battery provided by the first material.

In one embodiment, the battery diagnosing apparatus 100 may further include the charge/discharge adjustment unit 140.

The charge/discharge adjustment unit 140 may be configured to adjust the charge/discharge status of the target battery, such as the full-charge voltage of the target battery or the current rate of charge current or discharge current of the target battery, based on the diagnosis results of the diagnosis unit 130 described above. For example, when the target battery is diagnosed as deteriorated, the charge/discharge adjustment unit 140 may control a charge/discharge unit (not illustrated) that charges and discharges the target battery to lower the full-charge voltage of the target battery or reduce the current rate of charge/discharge current.

In one embodiment, among the first material and the second material included in the electrode active material of the target battery, the first material may be silicon (Si) or silicon oxide ($SiO_x$), and the second material may be a material including at least graphite.

The first generation unit 110, second generation unit 120, diagnosis unit 130, and charge/discharge adjustment unit 140 of the battery diagnosing apparatus 100 described above may be implemented with a combination of a processor and a program executed by the processor. The battery diagnosing apparatus 100 may be implemented with a single processor or two or more interlinked processors.

In one embodiment, the battery diagnosing apparatus 100 according to the present disclosure may be configured to be linked with various sensors such as a voltage sensor **12*a* for sensing the voltage of the battery and a current sensor 12*b*** for sensing the charge/discharge current of the battery.

Further, the battery diagnosing apparatus 100 according to the present disclosure may be configured to be linked with a communication unit 14 that enables communication with other remote apparatuses. The communication unit 14 may be configured to receive data transmitted from remote servers or communication terminals via a wired or wireless communication network and transmit the data to the battery diagnosing apparatus 100, or to transmit data generated by the battery diagnosing apparatus 100 to other servers or communication terminals. To this end, the communication unit 14 may include a communication modem that performs wired communication or wireless communication.

Further, the battery diagnosing apparatus 100 according to the present disclosure may be configured to be linked with a storage unit 16 capable of storing programs or data necessary for battery diagnosis. The storage unit 16 may include one, or two or more of various types of recording media such as Random Access Memory (RAM), Read Only Memory (ROM), Electrically Erasable Programmable Read Only Memory (EEPROM), flash memory, and registers.

In another embodiment, the battery diagnosing apparatus 100 according to the present disclosure may be configured to include one, or two or more of the voltage sensor **12*a*, current sensor 12*b*, communication unit 14, and storage unit 16** described above.

Figure 2:
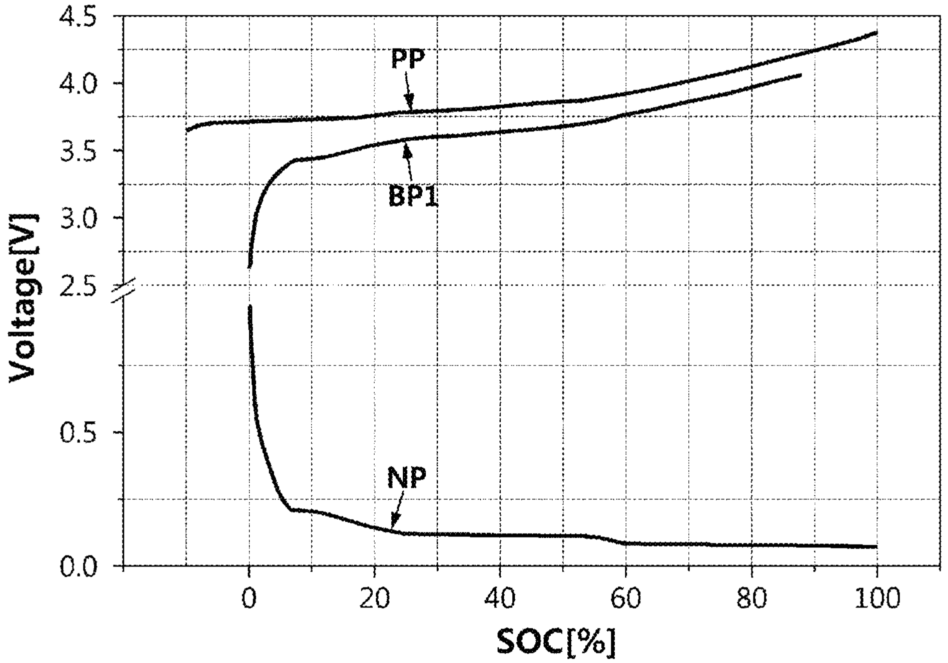
FIG. 2 is a diagram illustrating a first profile of a target battery.

FIG. 2 is a diagram illustrating a first profile BP1 of the target battery.

As illustrated in FIG. 2, the first generation unit 110 may first generate the first profile BP1 representing a correlation between the SOC and voltage of the target battery.

For example, the first profile generation module 112 of the first generation unit 110 may generate the first profile based on voltage values of the target battery measured during the charge or discharge of the target battery.

When the first material is silicon (Si) or silicon oxide ($SiO_x$) and the second material is graphite, the first profile generation module 112 may generate the first profile BP1 based on voltage values of the target battery measured during the "discharge" of the target battery.

For reference, silicon (Si) or silicon oxide ($SiO_x$) acts across the entire SOC range of the target battery during the charge of the target battery but acts only within a lower SOC range among the entire SOC range of the target battery during the discharge of the target battery. Therefore, the first portion corresponding to silicon (Si) or silicon oxide ($SiO_x$) may be easily distinguished from the remaining portion in the first profile BP1 obtained during the discharge of the target battery.

For example, to diagnose the status of the target battery, a simulation program needs to be used to shift or shrink the reference positive electrode profile and the reference negative electrode profile, respectively, in a predetermined direction to fit them to the positive electrode profile and the negative electrode profile that best represent the battery status, thereby obtaining a positive electrode profile PP and a negative electrode profile NP of the target battery corresponding to the first profile BP1. Here, the positive electrode profile PP is a profile that estimates a correlation between the SOC and positive electrode potential of the target battery, and the negative electrode profile NP is a profile that estimates a correlation between the SOC and negative electrode potential of the target battery.

For a battery employing an electrode active material such as silicon (Si) or silicon oxide ($SiO_x$), which deforms the shape of the battery profile in various directions as the battery deteriorates, the positive electrode profile PP and negative electrode profile NP obtained from the first profile BP1 tend to have significant errors.

Figure 3:
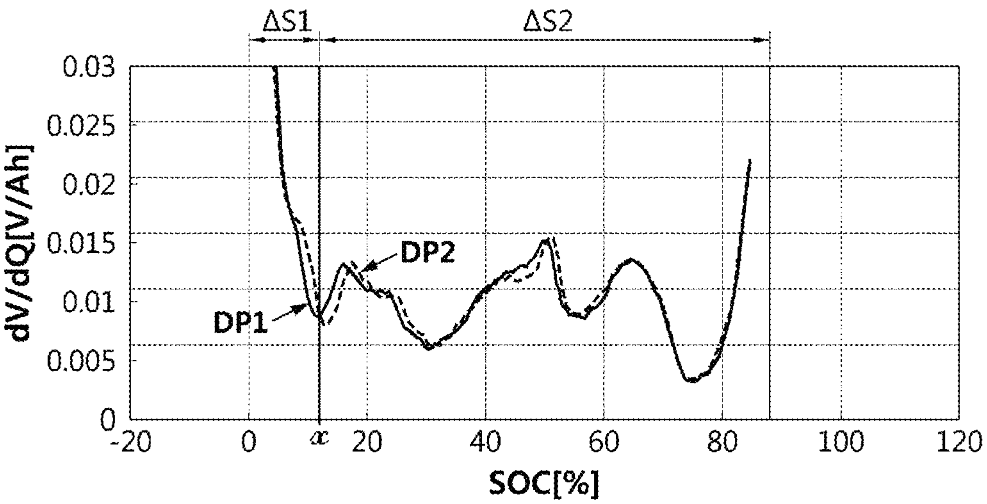
FIG. 3 is a diagram illustrating a differential profile of the target battery.

FIG. 3 is a diagram illustrating a differential profile DP2 of the target battery.

As illustrated in FIG. 3, the differential profile DP2 represents a correlation between the SOC of the target battery and a differential voltage obtained by differentiating the voltage of the target battery with respect to the capacity thereof.

For example, when the negative electrode active material of the target battery includes a first material and a second material, the first material is silicon (Si) or silicon oxide ($SiO_x$) and the second material is graphite, the differential profile DP2 obtained using the aforementioned simulation program has significant errors in a higher SOC range ΔS2 as well as a lower SOC range ΔS1, compared to an experimentally generated actual differential profile DP1 of the target battery.

Therefore, to remove errors caused by the first material, the second profile generation module 114 of the first generation unit 110 generates a second profile by dividing the first profile BP1 into a first portion corresponding to the first material and a second portion corresponding to the second material and removing the first portion from the first profile BP1. The second profile generation module 114 may divide the first profile BP1 into the first portion and the second portion based on a predetermined SOC value x.

Figure 4:
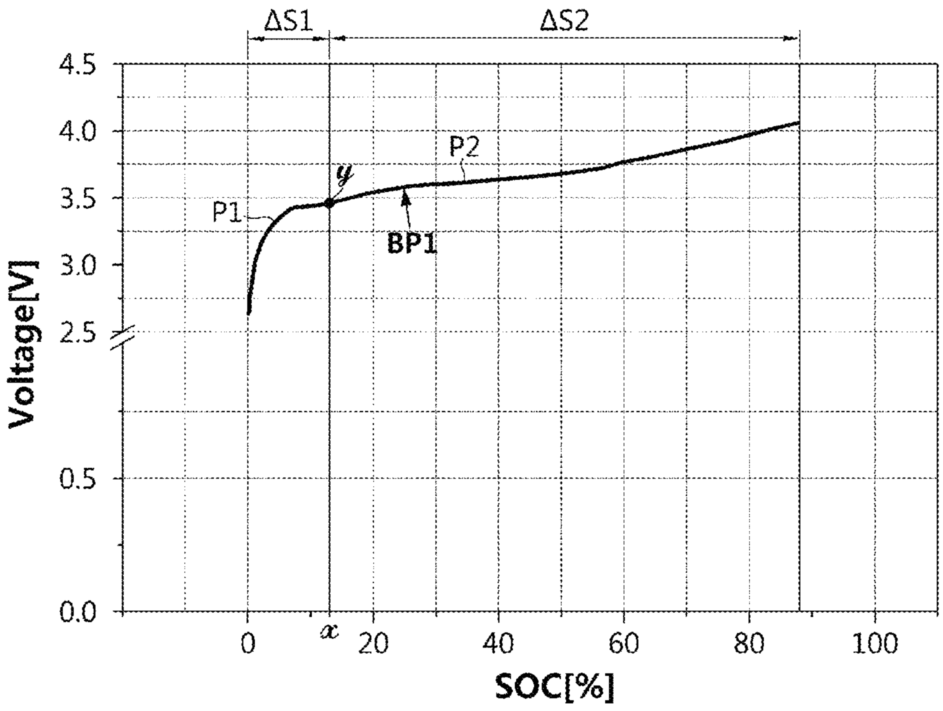
FIG. 4 is a diagram illustrating the first profile divided into multiple portions.

FIG. 4 is a diagram illustrating the first profile BP1 divided into multiple portions.

As illustrated in FIG. 4, the second profile generation module 114 may divide the first profile BP1 into a first portion P1 and a second portion P2 based on a predetermined SOC value x. The first portion P1 corresponds to the first material that acts in a relatively low SOC range during the discharge of the target battery, and the second portion P2 corresponds to the second material that acts in a relatively high SOC range.

Next, the second profile generation module 114 removes the first portion P1 from the first profile BP1 to generate the second profile.

In one embodiment, the SOC value x for determining the removal portion of the first profile BP1 may be determined in advance according to the composition ratio of the first material and the second material.

In another embodiment, the SOC value x may be determined based on a differential profile representing a correlation between the SOC of the target battery and a differential voltage obtained by differentiating the voltage of the target battery with respect to the capacity thereof. To this end, the second profile generation module 114 may include first to third sub-modules (not illustrated).

The first sub-module may generate a differential profile of the target battery, before generating the second profile.

Next, the second sub-module may detect a predetermined peak point or valley point among peak points and valley points appearing in the generated differential profile, and determining the SOC value x corresponding to the detected peak point or valley point.

For example, as illustrated in FIG. 3, the second sub-module may detect a valley point appearing at the lowest SOC among peak points and valley points appearing in the differential profile, and determining the SOC value x corresponding to the detected valley point.

Next, the third sub-module may divide the first profile BP1 into the first portion P1 and the second part P2 based on the determined SOC value x and remove the first portion P1 from the first profile BP1 to generate the second profile. The third sub-module may identify a point y in the first profile BP1 corresponding to the SOC value x to assign a portion of the first profile BP1 located in a lower SOC range than the point y to the first portion P1 and a portion of the first profile BP1 located in a higher SOC range than the point y to the second portion P2.

Figure 5:
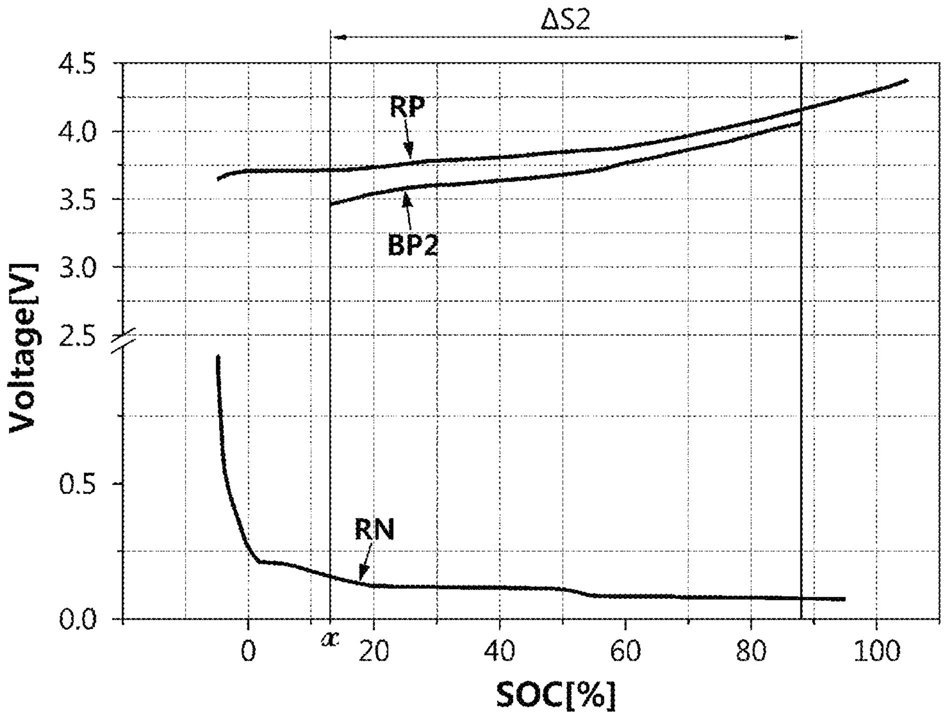
FIG. 5 is a diagram illustrating a second profile generated from the first profile of FIG. 4.

FIG. 5 is a diagram illustrating a second profile BP2 generated from the first profile of FIG. 4.

As illustrated in FIG. 5, once the second profile BP2 is generated by removing the first portion P1 from the first profile BP1, the second generation unit 120 may generate a third profile by estimating a correlation between the SOC and voltage of the target battery in the entire SOC range of the target battery based on the second profile BP2. To this end, the second generation unit 120 may include the adjustment module 122 and the third profile generation module 124.

The adjustment module 122 may be configured to generate an adjusted positive electrode profile and an adjusted negative electrode profile corresponding to the second profile BP2 by adjusting a reference positive electrode profile RP, which represents a correlation between the SOC and positive electrode potential of a predetermined reference battery, and a reference negative electrode profile RN, which represents a correlation between the SOC and negative electrode potential of the reference battery, before generating the third profile. The reference battery may be the target battery at the time of BOL, or a normal-status battery with the same configuration as the target battery.

The adjustment module 122 may generate the adjusted positive electrode profile and the adjusted negative electrode profile by adjusting at least one of the position, scale, and shape of each of the reference positive electrode profile and the reference negative electrode profile on a predetermined coordinate axis.

Figure 6:
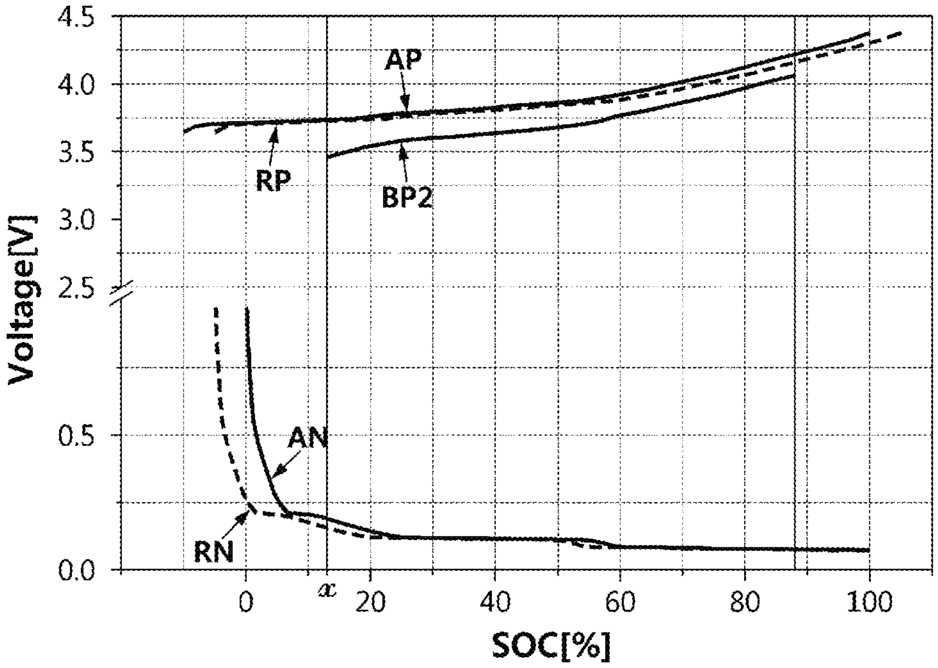
FIG. 6 is a diagram illustrating an adjusted positive electrode profile and an adjusted negative electrode profile corresponding to the second profile of FIG. 5.

FIG. 6 is a diagram illustrating an adjusted positive electrode profile AP and an adjusted negative electrode profile AN corresponding to the second profile of FIG. 5.

As illustrated in FIG. 6, the adjustment module 122 may select, as the adjusted positive electrode profile AP and the adjusted negative electrode profile AN, a candidate positive electrode profile and a candidate negative electrode profile that create a curve with the smallest error relative to the second profile BP2 through mutual combination, respectively, among various candidate positive electrode profiles and various candidate negative electrode profiles, which are generated by shifting or shrinking the reference positive electrode profile RP and the reference negative electrode profile RN, respectively, on a plane where the horizontal axis represents the SOC of the target battery and the vertical axis represents the voltage of the target battery.

Next, the third profile generation module 124 may generate a third profile based on the adjusted positive electrode profile AP and the adjusted negative electrode profile AN.

Figure 7:
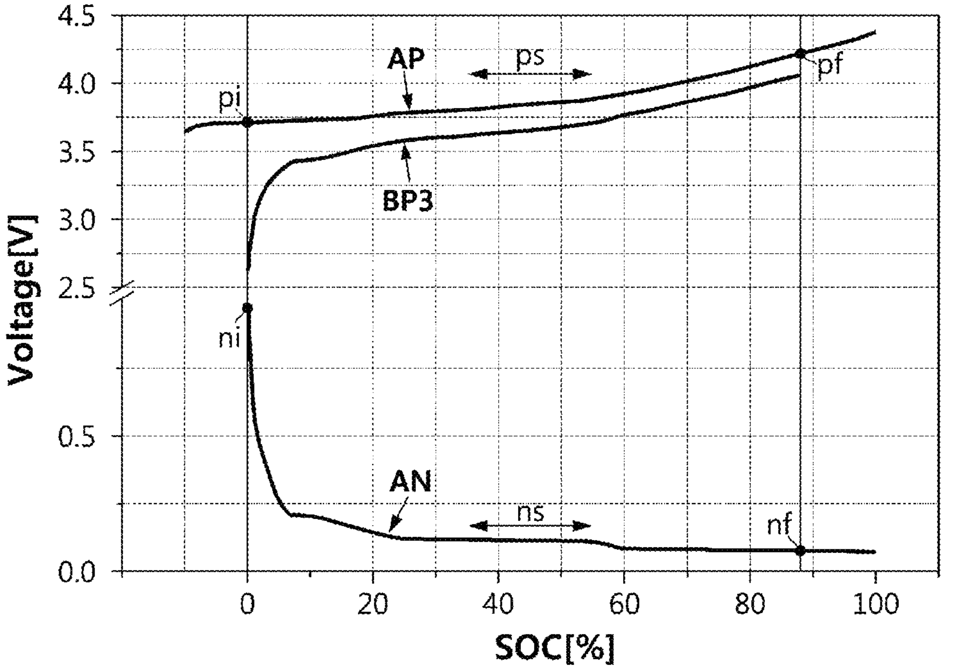
FIG. 7 is a diagram illustrating a third profile generated based on the adjusted positive electrode profile and the adjusted negative electrode profile of FIG. 6.

FIG. 7 is a diagram illustrating a third profile BP3 generated based on the adjusted positive electrode profile AP and the adjusted negative electrode profile AN of FIG. 6.

As illustrated in FIG. 7, the third profile generation module 124 may generate the third profile BP3 by calculating the potential difference for each SOC between the adjusted positive electrode profile AP and the adjusted negative electrode profile AN.

Next, the diagnosis unit 130 may diagnose the target battery based on the third profile BP3.

For example, when the negative electrode active material of the target battery includes silicon (Si) or silicon oxide ($SiO_x$) and graphite, the diagnosis unit 130 may identify an initial potential pi corresponding to the initial point of the third profile BP3 in the adjusted positive electrode profile AP with a relatively small error, and then infer an initial potential ni of the adjusted negative electrode profile AN from the initial potential pi and the initial voltage of the third profile BP3.

In this way, the diagnosis unit 130 may diagnose the target battery using diagnostic information obtained based on the third profile BP3. The diagnostic information may include at least one of the initial potential pi, final potential pf, and shrinkage ps of the adjusted positive electrode profile AP, and the initial potential ni, final potential nf, and shrinkage ns of the adjusted negative electrode profile AN.

The shrinkage ps of the adjusted positive electrode profile AP indicates the degree of shrinkage of the adjusted positive electrode profile AP in the SOC axis direction compared to the reference positive electrode profile RP.

Similarly, the shrinkage ns of the adjusted negative electrode profile AN indicates the degree of shrinkage of the adjusted negative electrode profile AN in the SOC axis direction compared to the reference negative electrode profile RN.

The diagnosis unit 130 may diagnose the target battery by comparing the diagnostic information with pre-stored reference information. The reference information may include at least one of the initial potential, final potential, and shrinkage of the reference positive electrode profile RP, and the initial potential, final potential, and shrinkage of the reference negative electrode profile RN.

The diagnosis unit 130 may calculate the capacity provided by the first material, among the total capacity provided by the electrode active material based on the third profile BP3, and diagnose the battery based on the calculated capacity.

The diagnosis unit 130 may calculate the capacity provided by the first material by excluding the capacity provided by the second material from the total capacity.

Figure 8:
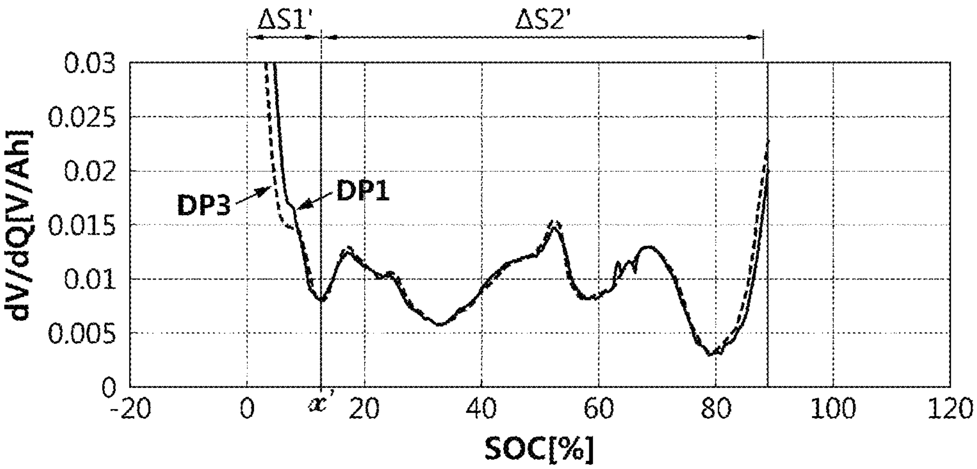
FIG. 8 is a diagram illustrating a differential profile obtained from the third profile of FIG. 7.

FIG. 8 is a diagram illustrating a differential profile DP3 obtained from the third profile of FIG. 7.

As illustrated in FIG. 8, when compared with the experimentally obtained actual differential profile DP1 of the target battery, the differential profile DP3 has some errors in a lower SOC range ΔS1' where the first material predominantly acts. However, the errors are minimized in a higher SOC range ΔS2' where the second material predominantly acts.

For example, when the first material is silicon (Si) or silicon oxide ($SiO_x$) and the second material is graphite, most of the capacity provided by the first material is provided in the lower SOC range ΔS1'. Further, most of the capacity provided by the second material is provided in the higher SOC range ΔS2'.

Therefore, the capacity provided by the first material may be calculated by excluding the capacity provided by the second material from the total capacity provided by the electrode active material that is a blend of the first material and the second material. The total capacity may be calculated by converting the SOC value of the target battery appearing in the third profile BP3 or the differential profile DP3 into a capacity value, or by applying a current integration method to the charge current or discharge current of the target battery. Further, the capacity provided by the second material may be calculated by converting the SOC change amount from a boundary value x' between the SOC range where the first material acts and the SOC range where the second material acts to the maximum SOC value of the target battery into the capacity.

Next, the diagnosis unit 130 may diagnose the target battery by comparing the calculated capacity provided by the first material with a predetermined reference capacity. The reference capacity may be the capacity provided by the first material of the target battery at the time of BOL, or the intended design capacity of the target battery provided by the first material.

In one embodiment, the battery diagnosing apparatus 100 may further include the charge/discharge adjustment unit 140.

The charge/discharge 140 may adjust the charge/discharge status of the target battery, such as the full-charge voltage of the target battery or the current rate of charge current or discharge current of the target battery, based on the diagnosis results of the diagnosis process described above. For example, when the target battery is diagnosed as deteriorated, the charge/discharge adjustment unit 140 may control a charge/discharge unit (not illustrated) that charges and discharges the target battery to lower the full-charge voltage of the target battery or reduce the current rate of charge/discharge current.

Figure 9:
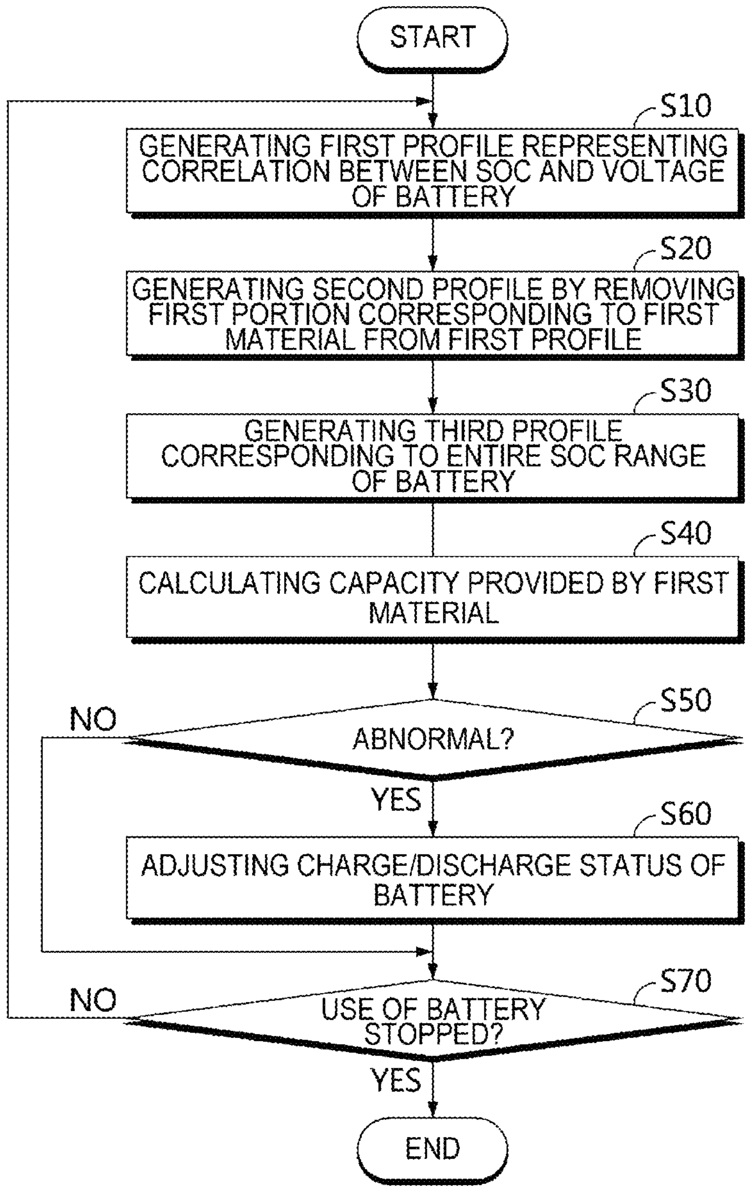
FIG. 9 is a flowchart illustrating a battery diagnosing method according to one embodiment of the present disclosure.

FIG. 9 is a flowchart illustrating a battery diagnosing method according to one embodiment of the present disclosure.

As illustrated in FIG. 9, the battery diagnosing method according to the present disclosure is a method of diagnosing a rechargeable battery in a non-destructive manner, and may be executed by a processor.

Further, a target battery to be diagnosed by the battery diagnosing method according to the present disclosure is battery employing an electrode active material that is a blend of a first material and a second material. The target battery may be a battery cell corresponding to a basic charge/discharge unit, a battery module in which multiple battery cells are connected in series and/or in parallel, or a battery pack in which multiple battery cells or multiple battery modules are connected in series and/or in parallel.

The processor may generate a second profile by dividing a first profile, which represents a correlation between the SOC and voltage of the target battery, into the first portion P1 corresponding to the first material and the second portion P2 corresponding to the second material and removing the first portion from the first profile.

To this end, the processor generates the first profile BP1 representing a correlation between the SOC and voltage of the target battery (S10).

At this time, the processor may generate the first profile based on voltage values of the target battery measured during the charge or discharge of the target battery. In particular, when the first material is silicon (Si) or silicon oxide ($SiO_x$) and the second material is graphite, the processor may generate the first profile BP1 based on voltage values of the target battery measured during the "discharge" of the target battery.

Next, the processor may generate the second profile BP2 by dividing the first profile BP1 into the first portion P1 and the second part P2 based on the predetermined SOC value x and removing the first portion P1 from the first profile BP1 (S20).

As described above with respect to FIG. 4, the first portion P1 may correspond to the first material that acts in a relatively low SOC range during the discharge of the target battery, and the second portion P2 may correspond to the second material that acts in a relatively high SOC range.

In one embodiment, the SOC value x for determining the removal portion of the first profile BP may be determined in advance according to the composition ratio of the first material and the second material.

In another embodiment, the SOC value x may be determined based on a differential profile representing a correlation between the SOC of the target battery and a differential voltage obtained by differentiating the voltage of the target battery with respect to the capacity thereof.

The processor may generate a differential profile of the target battery, before generating the second profile BP2, and may detect a predetermined peak point or valley point among peak points and valley points appearing in the generated differential profile, and determining the SOC value x corresponding to the detected peak point or valley point.

Next, the processor generates the third profile BP3 by estimating a correlation between the SOC and voltage of the target battery in the entire SOC range of the target battery based on the second profile BP2 (S30).

The processor may generate the adjusted positive electrode profile AP and the adjusted negative electrode profile AN corresponding to the second profile BP2 by adjusting the reference positive electrode profile RP, which represents a correlation between the SOC and positive electrode potential of a predetermined reference battery, and the reference negative electrode profile RN, which represents a correlation between the SOC and negative electrode potential of the reference battery, before generating the third profile BP3. The reference battery may be the target battery at the time of BOL, or a normal-status battery with the same configuration as the target battery.

For example, the processor may generate the adjusted positive electrode profile AP and the adjusted negative electrode profile AN by adjusting at least one of the position, scale, and shape of each of the reference positive electrode profile RP and the reference negative electrode profile RN on a predetermined coordinate axis.

As described above with reference to FIG. 6, the processor may select, as the adjusted positive electrode profile AP and the adjusted negative electrode profile AN, a candidate positive electrode profile and a candidate negative electrode profile that create a curve with the smallest error relative to the second profile BP2 through mutual combination, respectively, among various candidate positive electrode profiles and various candidate negative electrode profiles, which are generated by shifting or shrinking the reference positive electrode profile RP and the reference negative electrode profile RN, respectively, on a plane where the horizontal axis represents the SOC of the target battery and the vertical axis represents the voltage of the target battery.

Then, the processor may generate the third profile BP3 based on the adjusted positive electrode profile AP and the adjusted negative electrode profile AN. For example, the processor may generate the third profile BP3 by calculating the potential difference for each SOC between the adjusted positive electrode profile AP and the adjusted negative electrode profile AN.

Next, the processor calculates the capacity provided by the first material, among the total capacity provided by the electrode active material based on the third profile BP3, and diagnose the target battery based on the calculated capacity (S40).

For example, when the negative electrode active material of the target battery includes silicon (Si) or silicon oxide ($SiO_x$) and graphite, the processor may identify the initial potential pi corresponding to the initial point of the third profile BP3 in the adjusted positive electrode profile AP with a relatively small error, and then infer the initial potential ni of the adjusted negative electrode profile AN from the initial potential pi and the initial voltage of the third profile BP3.

In this way, the processor may diagnose the target battery using diagnostic information obtained based on the third profile BP3. The diagnostic information may include at least one of the initial potential pi, final potential pf, and shrinkage ps of the adjusted positive electrode profile AP, and the initial potential ni, final potential nf, and shrinkage ns of the adjusted negative electrode profile AN.

Here, the shrinkage ps of the adjusted positive electrode profile AP indicates the degree of shrinkage of the adjusted positive electrode profile AP in the SOC axis direction compared to the reference positive electrode profile RP.

Similarly, the shrinkage ns of the adjusted negative electrode profile AN indicates the degree of shrinkage of the adjusted negative electrode profile AN in the SOC axis direction compared to the reference negative electrode profile RN.

Further, the processor may diagnose the target battery by comparing the diagnostic information with pre-stored reference information. The reference information may include at least one of the initial potential, final potential, and shrinkage of the reference positive electrode profile RP, and the initial potential, final potential, and shrinkage of the reference negative electrode profile RN.

The processor may calculate the capacity provided by the first material, among the total capacity provided by the electrode active material based on the third profile BP3, and diagnose the battery based on the calculated capacity.

The processor may calculate the capacity provided by the first material by excluding the capacity provided by the second material from the total capacity.

Next, the processor may adjust a charge/discharge status of the target battery, such as the full-charge voltage of the target battery or the current rate of charge current or discharge current of the target battery, based on the diagnosis results for the target battery.

For example, when the target battery is diagnosed as deteriorated (S50), the processor may control a charge/discharge unit (not illustrated) that charges and discharges the target battery to lower the full-charge voltage of the target battery or reduce the current rate of charge/discharge current (S60).

The processor may repeat the above-described processes S10 to S60 until the use of the target battery is stopped (S70).

Figure 10:
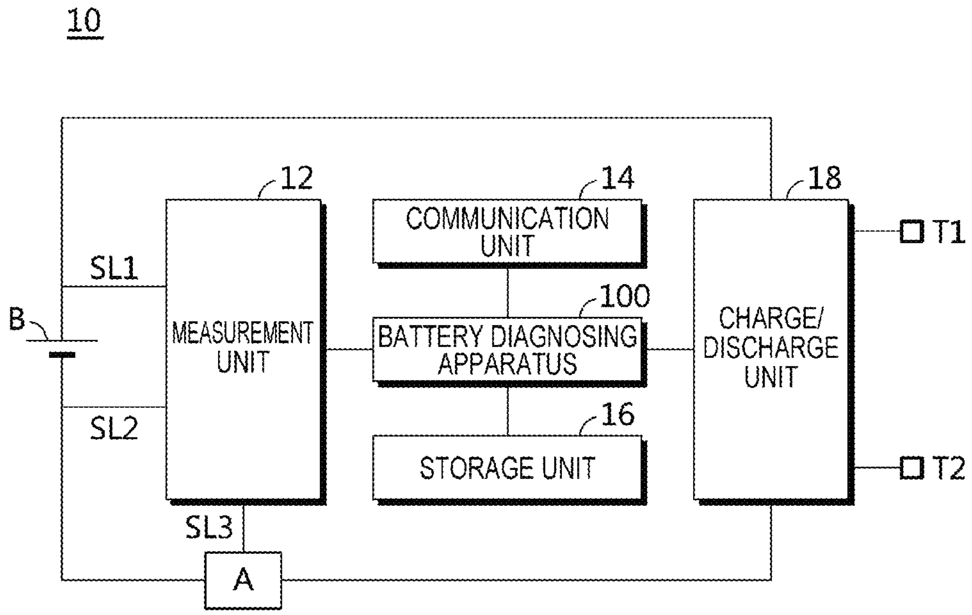
FIG. 10 is a diagram illustrating a battery pack according to one embodiment of the present disclosure.

FIG. 10 is a diagram illustrating a battery pack 10 according to one embodiment of the present disclosure.

As illustrated in FIG. 10, the battery pack 10 includes a rechargeable battery B and the battery diagnosing apparatus 100 according to the present disclosure. In one embodiment, the battery pack 10 may optionally further include a measurement unit 12, the communication unit 14, the storage unit 16, and a charge/discharge unit 18.

The measurement unit 12 may be configured to measure the voltage and/or current of the battery B. To this end, the measurement unit 12 may include the voltage sensor 12*a* and the current sensor 12*b* described above with reference to FIG. 1.

The measurement unit 12 may measure the voltage of the battery B through a first sensing line SL1 and a second sensing line SL2. Further, the measurement unit 12 may measure the current of the battery B through a third sensing line SL3 connected to a current measurement circuit A. The current measurement circuit A may include a shunt resistor.

The battery diagnosing apparatus 100 according to one embodiment of the present disclosure may obtain voltage values of the battery B via the measurement unit 12.

The communication unit 14 may be configured to enable communication with other remote devices. For example, the communication unit 14 may be configured to receive data transmitted from remote servers or communication terminals via a wired or wireless communication network and transmit the data to the battery diagnosing apparatus 100, or to transmit data generated by the battery diagnosing apparatus 100 to other servers or communication terminals. To this end, the communication unit 14 may include a communication modem that performs wired communication or wireless communication.

The storage unit 16 may be configured to store programs or data necessary for battery diagnosis. The storage unit 16 may include one, or two or more of various types of recording media such as RAM, ROM, EEPROM, flash memory, and registers.

The charge/discharge unit 18 may be configured to charge and/or discharge the battery B. To this end, the charge/discharge unit 18 may include a charger for charging the battery B, a discharger for discharging the battery B, and at least one switch for electrically connecting the battery B to terminals T1 and T2 of the battery pack 10, among others.

The battery diagnosing apparatus 100 according to one embodiment of the present disclosure may control the charge/discharge unit 18 to proceed with or stop the charge or discharge of the battery B, to set charge/discharge status, or to change the set charge/discharge status.

Figure 11:
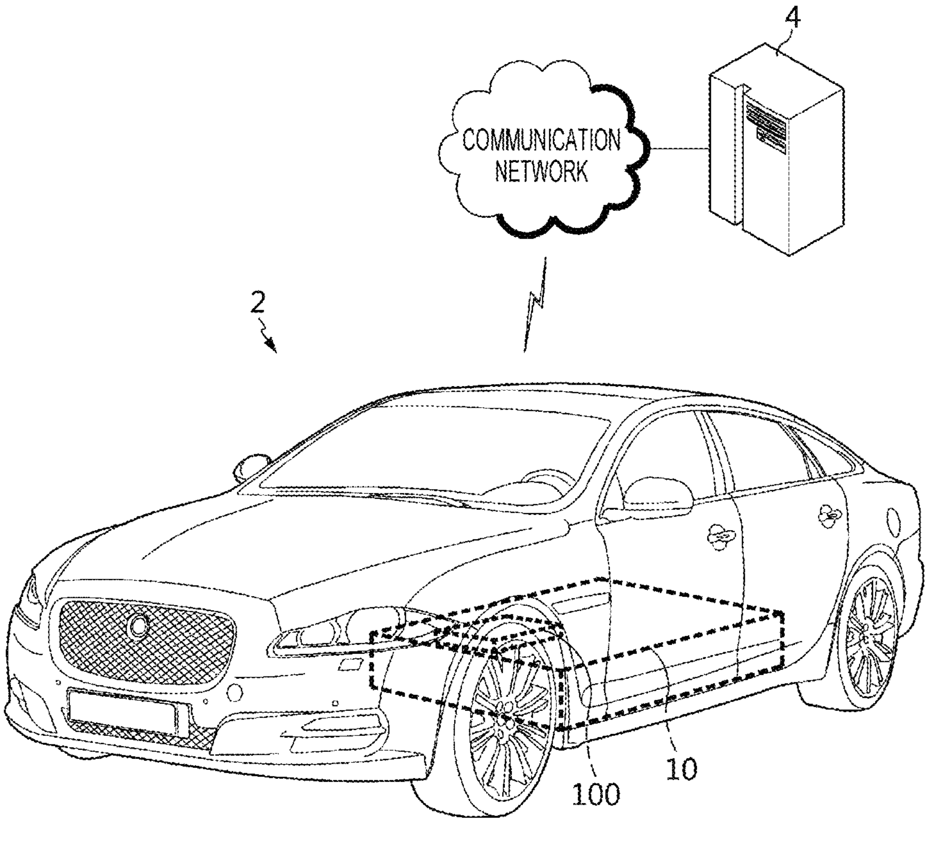
FIG. 11 is a diagram illustrating a vehicle according to one embodiment of the present disclosure.

FIG. 11 is a diagram illustrating a vehicle 2 according to one embodiment of the present disclosure.

As illustrated in FIG. 11, the vehicle 2 according to one embodiment of the present disclosure may include the battery pack 10, which provides electric energy necessary for the operation of the vehicle, and the battery diagnosing apparatus 100 according to the present disclosure.

The battery diagnosing apparatus 100 may be configured to be linked with an Electronic Control Unit (ECU), which controls the operation of the vehicle 2, or a Battery Management System (BMS) of the battery pack 10.

Further, the battery diagnosing apparatus 100 may be configured to receive data transmitted from a remote server 4 via a wired or wireless communication network, or to transmit data generated by the battery diagnosing apparatus 100 to the server 4.

For reference, the battery diagnosing apparatus 100 according to the present disclosure may be applied to various electric devices or electric systems other than vehicles, and may also be applied to an Energy Storage System (ESS).

As described above, according to the present disclosure, when diagnosing a battery employing an electrode active material that is a blend of a first material and a second material, a second profile is generated by dividing a first profile representing a correlation between the SOC and voltage of the battery into a first portion corresponding to the first material and a second portion corresponding to the second material and removing the first portion from the first profile, and the battery is diagnosed based on the second profile. As a result, it is possible to achieve rapid and accurate diagnosis of the battery even when the first material is a material, such as silicon or silicon oxide, which deforms the shape of the battery profile in various directions as the battery deteriorates.

Further, according to the present disclosure, a capacity provided by the first material is calculated, among the total capacity provided by the electrode active material, and the battery is diagnosed based on the calculated capacity. As a result, it is possible to diagnose the deterioration of the first material separately from the overall status of the battery. That is, the present disclosure may diagnose the deterioration of silicon or silicon oxide separately from graphite, for a battery employing a negative electrode active material that is a blend of silicon or silicon oxide and graphite.

Furthermore, it goes without saying that the embodiments of the present disclosure may solve various other technical issues not only in the relevant technical field but also in related technical fields, other than those mentioned in this specification.

The present disclosure has been described so far with reference to the embodiments. However, those skilled in the art will clearly understand that various modifications may be implemented within the technical scope of the present disclosure. Therefore, the embodiments disclosed above should be considered not as restrictive but as illustrative. That is, the true technical scope of the present disclosure is defined by the claims, and all differences within the scope equivalent thereto should be interpreted as being included in the present disclosure.

What is claimed is:

1. A battery diagnosing method for diagnosing a battery employing an electrode active material that is a blend of a first material and a second material, the method comprising:

generating a second profile by dividing a first profile representing a correlation between a State of Charge (SOC) and a voltage of the battery into a first portion corresponding to the first material and a second portion corresponding to the second material and removing the first portion from the first profile;

generating a third profile by estimating a correlation between the SOC and voltage of the battery in an entire SOC range of the battery based on the second profile;

calculating a capacity provided by the first material, among a total capacity provided by the electrode active material based on the third profile and diagnosing the battery based on the calculated capacity, and adjusting a charge/discharge status of the battery, corresponding to a full-charge voltage of the battery or a current rate of charge current or discharge current of the battery, based on diagnosing of the battery.

2. The battery diagnosing method according to claim 1, further comprising:

before generating the second profile, generating the first profile based on voltage values of the battery measured during discharge of the battery.

3. The battery diagnosing method according to claim 1, wherein in generating the second profile, the first profile is divided into the first portion and the second portion based on a predetermined SOC value.

4. The battery diagnosing method according to claim 3, wherein the predetermined SOC value is determined in advance according to a composition ratio of the first material and the second material.

5. The battery diagnosing method according to claim 1, comprising:

before generating the second profile, generating a differential profile representing a correlation between the SOC of the battery and a differential voltage obtained by differentiating the voltage of the battery with respect to a capacity; and detecting a predetermined peak point or valley point among peak points and valley points appearing in the differential profile, and determining an SOC value corresponding to the detected peak point or valley point;

wherein the first profile is divided into the first portion and the second portion based on the determined SOC value.

6. The battery diagnosing method according to claim 1, comprises:

before generating the third profile, generating an adjusted positive electrode profile and adjusted negative electrode profile corresponding to the second profile by adjusting a reference positive electrode profile representing a correlation between an SOC and a positive electrode potential of a predetermined reference battery and a reference negative electrode profile representing a correlation between the SOC and a negative electrode potential of the reference battery; and generating the third profile based on the adjusted positive electrode profile and the adjusted negative electrode profile.

7. The battery diagnosing method according to claim 6, wherein the adjusted positive electrode profile and the adjusted negative electrode profile are generated by adjusting at least one of a position, scale, and shape of each of the reference positive electrode profile and the reference negative electrode profile on a predetermined coordinate axis.

8. The battery diagnosing method according to claim 6, wherein the third profile is generated by calculating a potential difference for each SOC between the adjusted positive electrode profile and the adjusted negative electrode profile.

9. The battery diagnosing method according to claim 1, wherein the capacity provided by the first material is calculated by excluding a capacity provided by the second material from the total capacity.

10. The battery diagnosing method according to claim 1, comprising comparing the calculated capacity with a predetermined reference capacity to diagnose the battery.

11. The battery diagnosing method according to claim 1, wherein the first material is silicon or silicon oxide, and the second material includes graphite.

12. A battery diagnosing apparatus for diagnosing a battery employing an electrode active material that is a blend of a first material and a second material, the apparatus comprising:

one or more processors; and recording media configured to store one or more programs that, when executed by the one or more processors, cause the one or more processors to perform:

generating a second profile by dividing a first profile representing a correlation between a State of Charge (SOC) and a voltage of the battery into a first portion corresponding to the first material and a second portion corresponding to the second material and removing the first portion from the first profile;

generating a third profile by estimating a correlation between the SOC and voltage of the battery in an entire SOC range of the battery based on the second profile;

calculating a capacity provided by the first material, among a total capacity provided by the electrode active material based on the third profile and diagnosing the battery based on the calculated capacity, and a charge/discharge adjuster configured to adjust a charge/discharge status of the battery, corresponding to a full-charge voltage of the battery or a current rate of charge current or discharge current of the battery, based on diagnosing of the battery.

13. The battery diagnosing apparatus according to claim 12, wherein execution of the one or more programs by the one or more processors causes the one or more processors to perform generating the second profile by dividing the first profile into the first portion and the second portion based on a predetermined SOC value and removing the first portion from the first profile.

14. The battery diagnosing apparatus according to claim 12, wherein execution of the one or more programs by the one or more processors causes the one or more processors to perform:

generating an adjusted positive electrode profile and an adjusted negative electrode profile corresponding to the second profile by adjusting a reference positive electrode profile representing a correlation between an SOC and a positive electrode potential of a predetermined reference battery and a reference negative electrode profile representing a correlation between the SOC and a negative electrode potential of the reference battery; and generating the third profile based on the adjusted positive electrode profile and the adjusted negative electrode profile.

15. A battery pack comprising the battery diagnosing apparatus according to claim 12.

16. A vehicle comprising the battery diagnosing apparatus according to claim 12.

17. A non-transitory computer-readable storage medium having stored therein a program that, when executed, causes a computer to execute a battery diagnosing method for diagnosing a battery employing an electrode active material that is a blend of a first material and a second material, the method comprising:

generating a second profile by dividing a first profile representing a correlation between a State of Charge (SOC) and a voltage of the battery into a first portion corresponding to the first material and a second portion corresponding to the second material and removing the first portion from the first profile;

generating a third profile by estimating a correlation between the SOC and voltage of the battery in an entire SOC range of the battery based on the second profile;

calculating a capacity provided by the first material, among a total capacity provided by the electrode active material based on the third profile and diagnosing the battery based on the calculated capacity, and adjusting a charge/discharge status of the battery, corresponding to a full-charge voltage of the battery or a current rate of charge current or discharge current of the battery, based on diagnosing of the battery.

* * * * *